United States Patent [19]
Kim et al.

[11] Patent Number: 5,132,234
[45] Date of Patent: Jul. 21, 1992

[54] METHOD OF PRODUCING A BIPOLAR CMOS DEVICE

[75] Inventors: Myung-Sung Kim, Seoul; Soon-Kwon Lim, Buchon, both of Rep. of Korea

[73] Assignee: Samsung Electronics Co., Ltd., Suweon City, Rep. of Korea

[21] Appl. No.: 727,532

[22] Filed: Jul. 9, 1991

[30] Foreign Application Priority Data

Feb. 25, 1991 [KR] Rep. of Korea .................. 91-3021

[51] Int. Cl.⁵ .......................................... H01L 21/265
[52] U.S. Cl. ................................... 437/31; 437/56; 437/59; 437/162; 437/200; 148/DIG. 9
[58] Field of Search .................. 437/31, 56, 57, 59, 437/162, 200; 148/DIG. 9

[56] References Cited

U.S. PATENT DOCUMENTS

| 4,784,966 | 11/1988 | Chen | 437/31 |
| 4,902,639 | 2/1990 | Ford | 437/56 |
| 4,987,089 | 1/1991 | Roberts | 437/59 |
| 5,026,654 | 6/1991 | Tamba et al. | 437/57 |
| 5,047,357 | 9/1991 | Eklund | 437/57 |

Primary Examiner—Brian E. Hearn
Assistant Examiner—Tuan Nguyen
Attorney, Agent, or Firm—Cushman, Darby & Cushman

[57] ABSTRACT

A method of producing a bipolar CMOS device for providing a unipolar CMOS transistor with a polysilicon gate and a self-aligned NPN and VPNP transistor on a same chip, so that a high performance analog and digital BiCMOS device can be realized.

4 Claims, 4 Drawing Sheets

METHOD OF PRODUCING A BIPOLAR CMOS DEVICE

BACKGROUND OF THE INVENTION

1. Field of the Invention

The present invention relates to a method of producing a semiconduction device, and more particularly to a method of producing a bipolar CMOS device for comprising a unipolar CMOS transistor with a polysilicon gate and a self-aligned NPN and VPNP transistor on a same chip.

2. Description of the Prior Art

In a conventional method of producing a bipolar CMOS device, as a bipolar NPN and VPNP transistor don't be self-aligned with an emitter and base, it is inferior to a self-aligned transistor in a packing density and an operating speed.

Also, a lateral bipolar NPN and PNP transistor is inferior to a vertical bipolar NPN and PNP transistor in a current handling capability and an operating speed.

SUMMARY OF THE INVENTION

Therefore, the present invention was made in order to solve the above-mentioned problems.

An object of the present invention is to provide a method of producing a bipolar CMOS device for realizing high speed, high efficiency, and high packing density.

To achieve the above objects, the present invention is realized by a CMOS transistor with a polysilicon gate and self-aligned bipolar NPN and VPNP transistor on a same chip.

BRIEF DESCRIPTION OF THE DRAWINGS

Above objects and features of the present invention will be apparent from the following detailed description when read in conjunction with the accompanying drawings.

DETAILED DESCRIPTION OF THE PREFERRED EMBODIMENTS

The present invention ultimately is characterized in that comprises a NPN and VPNP transistor self-aligned with polysilicon and a CMOS transistor with a polysilicon gate.

The method of producing a bipolar CMOS device according to the present invention is as follows.

Figure 1:
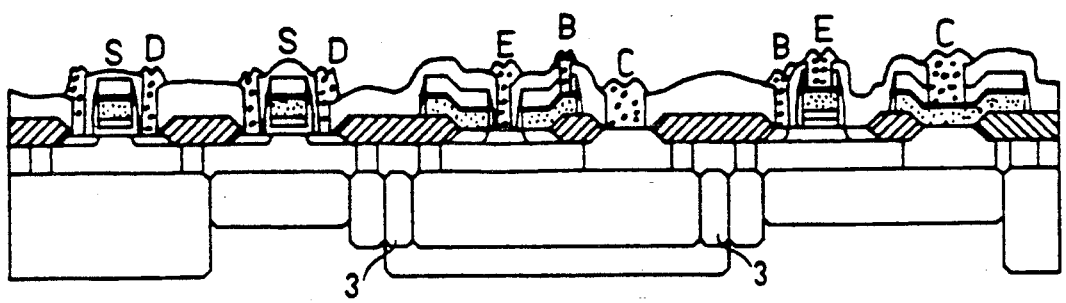
FIG. 1 is a vertical structure view explaining a bipolar CMOS device produced according to the present invention.
Figure 2A:
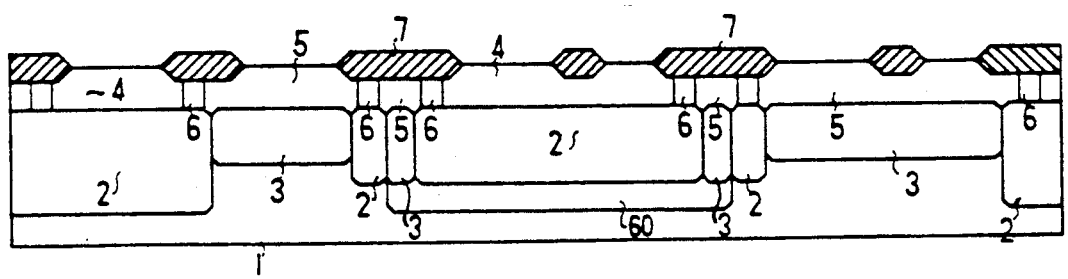
FIGS. 2A to 2O are a vertical structure view explaining a method of producing a bipolar CMOS device according to the present invention.

FIG. 2A shows, after a formation of a n type deep buried layer for a VPNP transistor, a shape eliminated a layer of oxide, which is formed by means of a local oxidation of silicon(LOCOS) according to a normal twin well and twin bottom process.

So as to isolate the p+type bottom layer 2 to be a collector region of a VPNP transistor from the p type substrate 1, a deep buried layer 60 is formed, and then the p+type bottom layer 2 and the n+type bottom layer 3 are formed with a conventional process.

An intrinsic epitaxial layer is grown over the layers 2 and 3.

A p type well 4 and a n type well 5 are formed, and a channel stop region 6 is formed to prevent a field inversion.

A layer of oxide 7 is selectively formed with a conventional local oxidation of silicon(LOCOS).

Figure 2B:
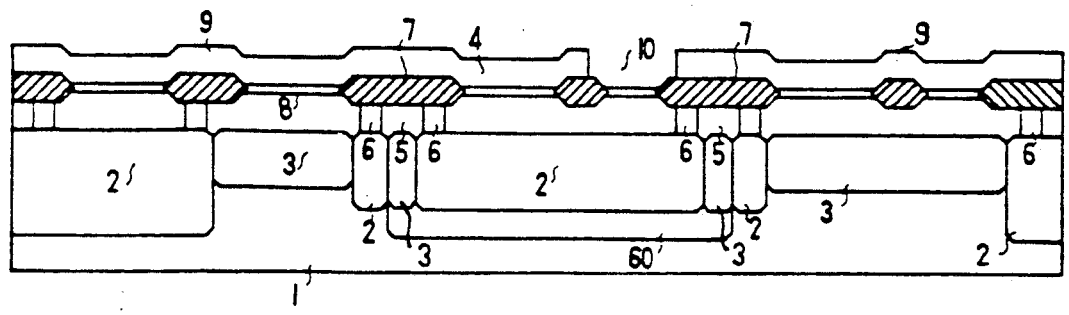

As shown in FIG. 2B, after a sacrificial oxide layer 8 is grown over the wafer to a thickness of 400~800Å, the photoresist film is coated over the entire surface of the wafer to form a collector region of the vertical PNP(VPNP) transistor.

The collector window 10 of the VPNP transistor is opened with a photolithography, and then the B ions are implanted through the window 10 to a dose of $5 \times 10^{14} \sim 2 \times 10^{15}$ ions/cm$^2$.

Figure 2C:
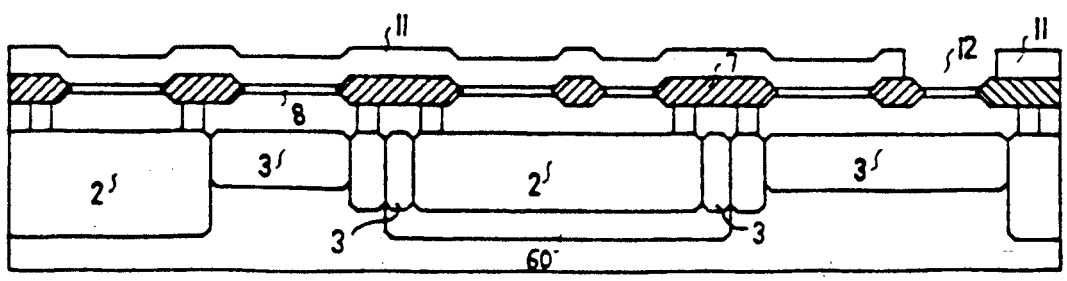

As shown in FIG. 2C, the photoresist 9 is removed, and a photoresist 11 is coated over the entire surface of the wafer to form a collector region of the NPN transistor.

A collector window 12 is opened on the collector region of the NPN transistor with a photolithography, and the P ions are implanted through the collector window 12 to a dose of $5 \times 10^{14} \sim 2 \times 10^{15}$ ions/cm$^2$.

Figure 2D:
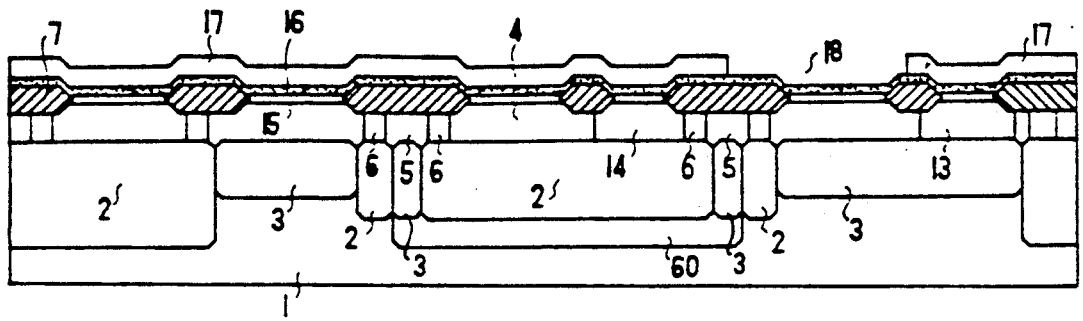

As shown in FIG. 2D, the photoresist 11 is removed, and the wafer is annealed at high temperature so that a diffused collector region 13 of the NPN transistor and a diffused collector region 14 of the VPNP transistor are formed.

The sacrificial oxide layer 8 is removed with a wet etching, and the gate oxide layer 15 is grown to a thickness of 100~300Å.

After the layer of polysilicon 16 is deposited over the entire surface of the wafer to a thickness of 300~600Å, a photoresist 17 is coated over the wafer to form a base region of the NPN transistor. The base window 18 of the NPN transistor is opened on the base region with a photolithography, and then the B ions are implanted through the base window 18 to a dose of $5 \times 10^{13} \sim 5 \times 10^{14}$ ions/cm$^2$.

Figure 2E:
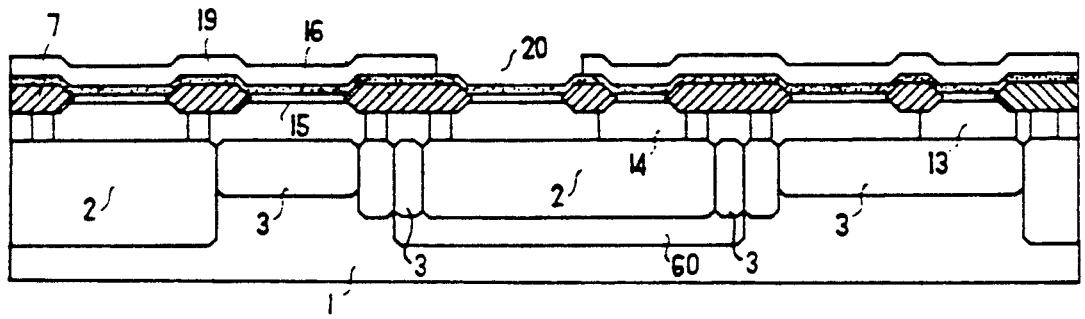

As shown in FIG. 2E, the photoresist 17 is removed, and a photoresist 19 is coated over the entire surface of the wafer to form a base region of the VPNP transistor.

The base window 20 of the VPNP transistor is opened on the base region with a photolithography, and the P ions are implanted through the base window 20 to a dose of $1 \times 10^{14} \sim 7 \times 10^{14}$ ions/cm$^2$. (The ion implantation described in relation to FIG. 2D and 2E can be changed the order.)

Figure 2F:
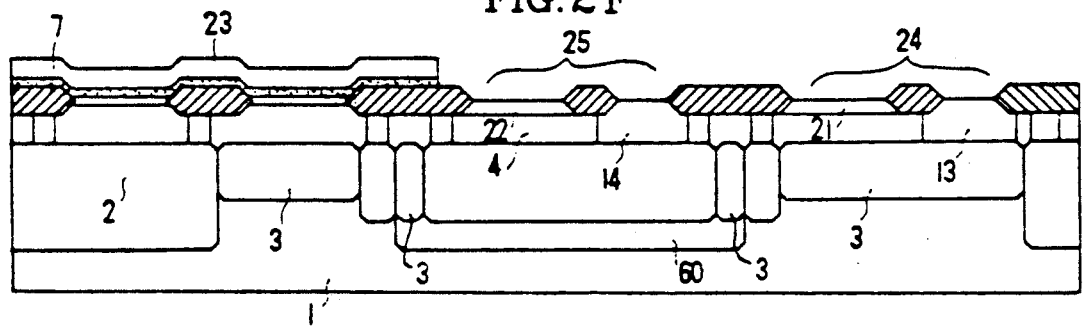
Figure 2G:
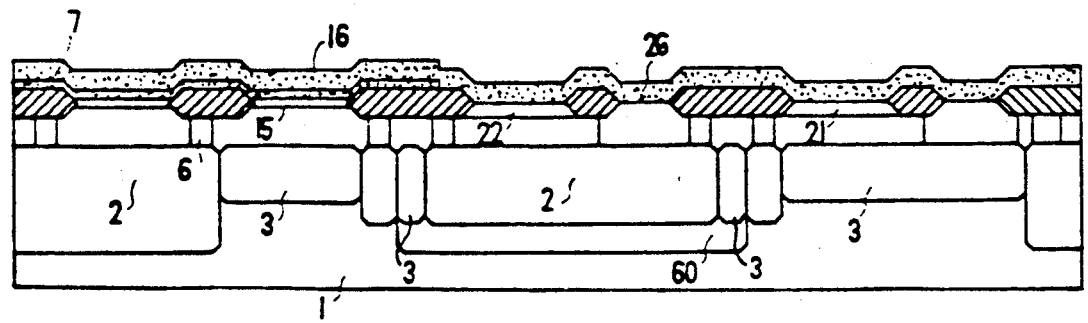

As shown in FIG. 2F, the photoresist 19 is removed, and a conventional annealing is performed at high temperature so that an intrinsic base region 21 of the NPN transistor and an intrinsic base region 22 of the VPNP transistor are formed.

A photoresist 23 is coated over the entire surface of the wafer.

A region 24 of the NPN transistor, a region 25 of the VPNP transistor are etched with a photolithography so that a layer of polysilicon 16 and a gate oxide film are formed.

As shown in FIG. 2C, the photoresist 23 on the wafer is removed. A layer of polysilicon 26 is deposited to a thickness of 2,000~4,000Å, and then the As ions are implanted to a dose of $6 \times 10^{15} \sim 1 \times 10^{16}$ ions/cm$^2$.

Figure 2H:
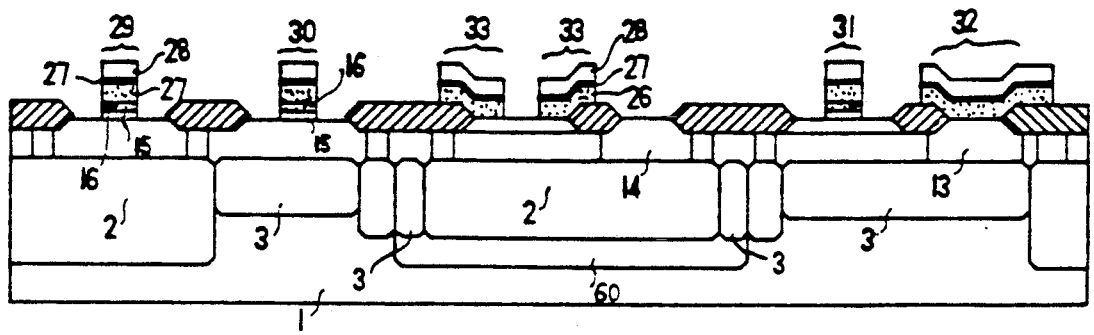

As shown in FIG. 2H, a WSi$_2$ film 27 is deposited on the entire surface of above polysilicon to a thickness of 1,000~2,000Å with a chemical vapor deposition(CVD), and an oxide film 28 is deposited on the WSi$_2$ film to a thickness of 2,000~4,000Å with a CVD.

The oxide film 28, the WSi₂ film 27, the layer of polysilicon 16, and the gate oxide film 15 are etched with a photolithography so that a gate 29 of the n channel MOS transistor, a gate 30 of the p channel MOS transistor, an emitter 31 and a collector 32 of the NPN transistor, and a base 33 of the VPNP transistor are formed.

Figure 2I:
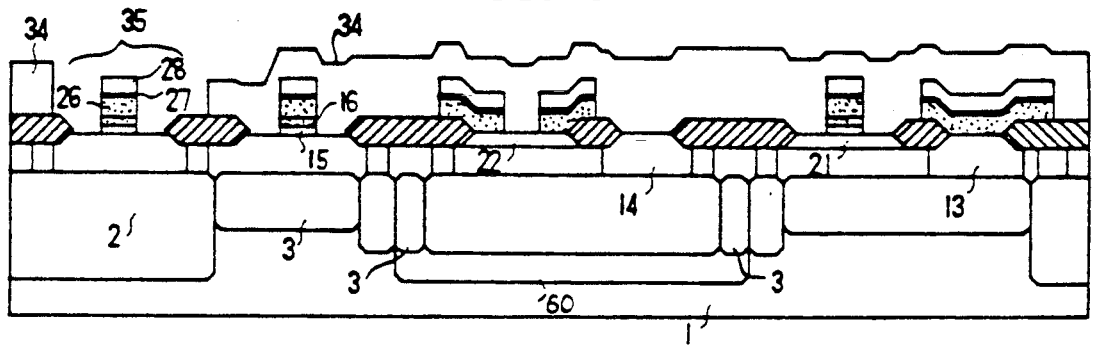
Figure 2J:
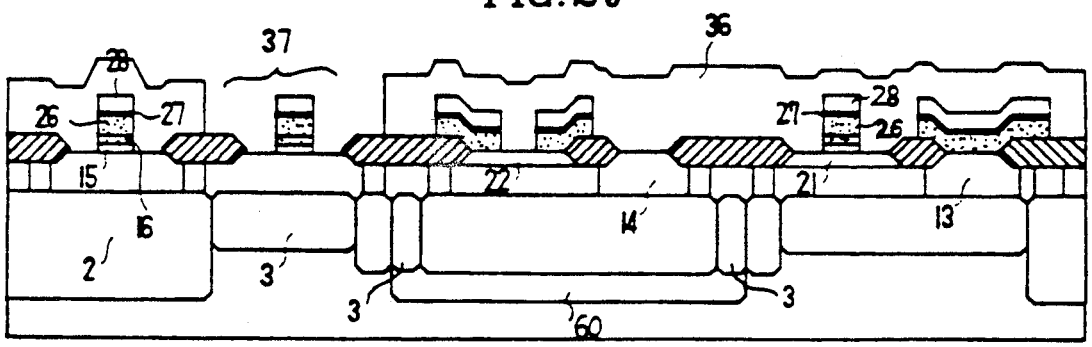

As shown in FIG. 2I, the entire surface of the wafer is coated with a photoresist 34 by means of a conventional process, and the window 35 of the n channel MOS transistor is opened.

The P ions are implanted through the window 35 to form a n type lightly doped drain.

As shown in FIG. J, after the photoresist 34 is removed, the entire surface of the wafer is coated with a photoresist 36 to form a p type lightly doped drain.

Figure 2K:
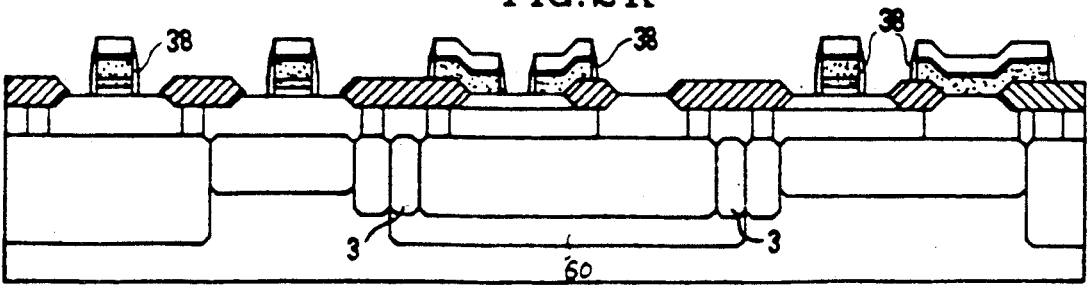

Next, a window 37 of the p channel MOS transistor is opened, and then the B ions or the BF₂+ ions are implanted through the window 37. As shown in FIG. 2K, the photoresist 36 is removed.

Figure 2L:
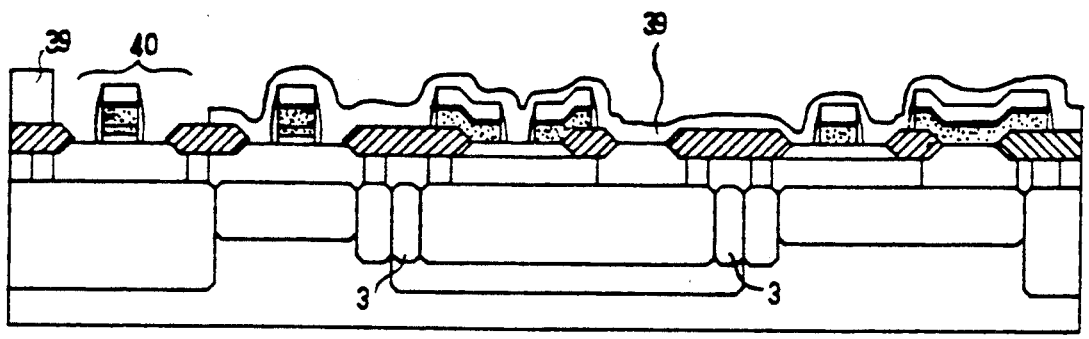

The oxide film is deposited to a thickness of 3,000~7,000Å with a conventional chemical vapor deposition(CVD), and a reactive ion etching (RIE) of a anisotrophic etching is performed to form a side wall of oxide 38. As shown in FIG. 2L, so as to form a source and a drain of the n channel MOS transistor, the entire surface of the wafer is coated with a photoresist 39.

Figure 2M:
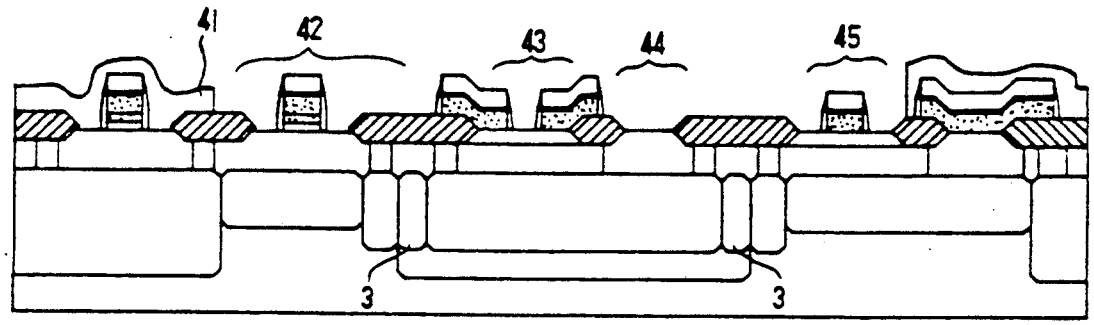

A window 40 of the n channel MOS transistor is opened, and the As ions are implanted through the window 40 to a dose of $1\times10^{15}\sim9\times10^{15}$ ions/cm². As shown in FIG. 2M, the photoresist 39 is removed.

So as to form a source and a drain 42 of the p channel MOS transistor, an emitter 43 and a collector 44 of the VPNP transistor, and an extrinsic base 45 of NPN transistor, the entire surface of the wafer is coated with a photoresist 41.

Next, the window 42, 43, 44 and 45 are opened.

That is, a source and drain region of the p channel MOS transistor, an emitter region and a collector region of the VPNP transistor, and an extrinsic base region of the NPN transistor are exposed.

Figure 2N:
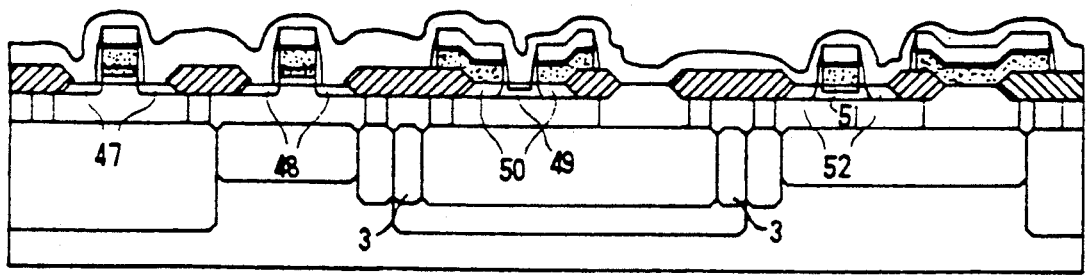

As shown in FIG. 2N, after a BF₂+ ions are implanted to a dose of $1\times10^{15}\sim5\times10^{15}$ ions/cm², the photoresist 41 is removed. The oxide film 46 is deposited on the entire surface of the wafer to a thickness of 2,000~7,000 Å with a CVD.

A normal annealing is performed at high temperature so that a diffused source and drain region 47 of the n channel MOS transistor, a diffused source and drain region 48 of the p channel MOS transistor, a diffused emitter region 49 and a diffused extrinsic base region 50 of the VPNP transistor, and a diffused emitter region 51 and a diffused extrinsic base region 52 of the NPN transistor are formed.

At this time, the emitter region 51 of the NPN transistor is formed by diffusing the As ions from the layer of polysilicon 16 doped with a high concentration As.

The extrinsic base region 50 of the VPNP transistor also is formed with a same method.

In the above mentioned steps, the step of forming the WSi₂ film over the layer of polysilicon can be omitted.

Figure 2O:
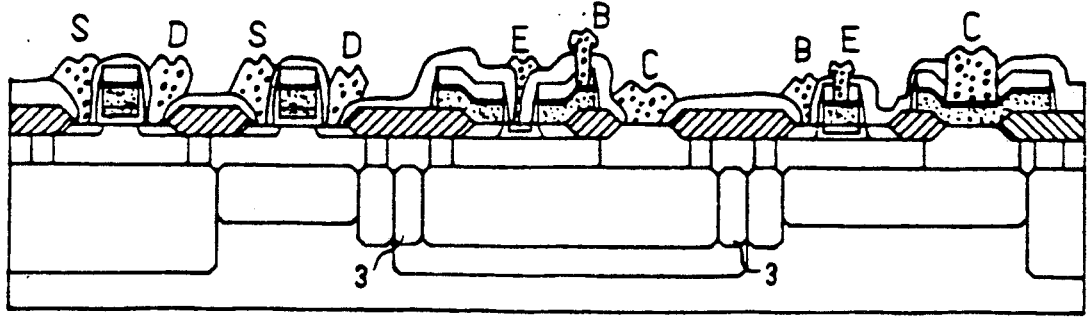

Next, a normal contact process and barrier metal and metalization are performed so that all steps is up as shown in FIG. 2O.

A bipolar CMOS device produced according to the present invention is superior to a unself-aligned device in an operating speed and an integrated density by self-aligning a bipolar NPN transistor and a VPNP transistor.

Also, a CMOS device with a silicon gate and a self-aligned NPN and VPNP transistor is integrated on a same chip so that an analog and digital BiCMOS device can be realized.

We claim:

1. A method of producing a bipolar CMOS device for comprising an unipolar CMOS transistor with a polysilicon gate and a self-aligned NPN and VPNP transistor on a same chip comprising:

a first step of forming a deep buried layer 60 for isolating a p+ type bottom layer 2 to be a collector region of a VPNP transistor from a p type substrate 1, forming said p+ type bottom layer 2 and a n+ type bottom layer 3 with a conventional process, growing an intrinsic epitaxial layer over said layers 2 and 3, forming a p type well 4 and a n type well 5, forming a channel stop region 6 for preventing field inversion, and selectively forming a layer of oxide 7 with a normal local oxidation of silicon (LOCOS);

a second step of growing a sacrifical layer of oxide 8 over the wafer to a thickness of 400~800 Å, coating an entire surface of a wafer with a photoresist 9 to form a collector region of said vertical PNP (VPNP) transistor, opening the collector window 10 of said VPNP transistor with a photolithography, and implanting a B ions through said window 10 to a dose of $5\times10^{14}\sim2\times10^{15}$ ions/cm²;

a third step of removing said photoresist 9, coating a photoresist 11 over an entire surface of a wafer to form a collector region of a NPN transistor, opening a collector window 12 on said collector region of said NPN transistor with a photolithography, and implanting a P ions through said collector window 12 to a thickness of $5\times10^{14}\sim2\times10^{15}$ ions/cm².

a fourth step of removing said photoresist 11, forming said diffused collector region 13 of said NPN transistor and said diffused collector region 14 of said VPNP transistor by annealing said wafer at high temperature, removing said sacrificial layer of oxide 8 with a wet type etching, growing a gate oxide film 15 to a thickness of 100~300 Å, depositing said layer of polysilicon 16 over an entire surface of said wafer to a thickness 300~600 Å, coating a photoresist 17 over said layer 16 to form a base region of said NPN transistor, opening a base window 18 of said NPN transistor on said base region with a photolithography, and implanting a B ions through said base window 18 to a dose of $1\times10^{14}\sim5\times10^{14}$ ions/cm²;

a fifth step of removing said photoresist 17, coating a photoresist 19 over an entire surface of said wafer to form a base region of said VPNP transistor, opening a base window 20 of said VPNP transistor on said base region with a photolithography, and implanting a P ions through said base window 20 to a dose of $1\times10^{14}\sim7\times10^{14}$ ions/cm²;

a sixth step of removing said photoresist 19, forming an intrinsic base region 21 of said NPN transistor and an intrinsic base region 22 of said VPNP transistor by performing a conventional annealing at high temperature, coating a photoresist 23 over an entire surface of said wafer, and forming a layer of polysilicon 16 and a gate oxide film by etching a region 24 of said NPN transistor, a region 25 of said VPNP transistor with a photolithography;

a seventh step of removing said photoresist 23 on said wafer, depositing a layer of polysilicon 26 to a thickness of 2,000~4,000 Å, and implanting a As ions to a dose of $6 \times 10^{15} \sim 1 \times 10^{16}$ ions/cm$^2$;

an eighth step of depositing a WSi$_2$ film 27 on an entire surface of said wafer to a thickness of 1,000~2,000 Å with a chemical vapor deposition (CVD), depositing an oxide film 28 on said WSi$_2$ film to a thickness of 2,000~4,000 Å with a CVD, and forming a gate 29 of said n channel MOS transistor, a gate 30 of said p channel MOS transistor, an emitter 31 and a collector 32 of said NPN transistor, and a base 33 of said VPNP transistor by removing said oxide film 28, said WSi$_2$ film 27, said layer of polysilicon 16, and a gate oxide film 15 are with a photolithography;

a ninth step of coating said an entire surface of said wafer with a photoresist 34 by means of a conventional process, opening a window 35 of said n channel MOS transistor, and implanting a P ions through said window 35 to form a n type lightly doped drain;

a tenth step of removing said photoresist 34, coating an entire surface of said wafer with a photoresist 36 to form a p type lightly doped drain, opening a window 37 of said p channel MOS transistor, and implanting a B ions or a BF$_2^+$ ions through said window 37;

an eleventh step of removing said photoresist 36, depositing an oxide film to a thickness of 3,000~7,000 Å with a conventional chemical vapor deposition (CVD), and performing a reactive ion etching (RIE) of a anisotrophic etching to form a side wall of oxide 38;

a twelfth step of coating an entire surface of said wafer with a photoresist 39, for forming a source and a drain of said n channel MOS transistor, opening a window 40 of said n channel MOS transistor, and implanting an As ions through said window 40 to a dose of $1 \times 10^{15} \sim 9 \times 10^{15}$ ions/cm$^2$;

a thirteenth step of removing said photoresist 39, coating an entire surface of said wafer with a photoresist 41 so as to form a source and a drain 42 of said p channel MOS transistor, an emitter 43 and a collector 44 of said VPNP transistor, and an extrinsic base 45 of said NPN transistor, and opening a window 42, 43, 44 and 45; and a fourteenth step of implanting a BF$_2^+$ ions to a thickness of $1 \times 10^{15} \sim 5 \times 10^{15}$ ions/cm$^2$, removing said photoresist 41, depositing an oxide film 46 on an entire surface of said wafer to a thickness of 2,000~7,000 Å with a CVD, and forming a diffused source and drain region 47 of the n channel MOS transistor, a diffused source and drain region 48 of said p channel MOS transistor, a diffused emitter region 49 and a diffused extrinsic base region 50 of said VPNP transistor, and forming a diffused emitter region 51 and a diffused extrinsic base region 52 of said NPN transistor by performing a normal annealing is performed at high temperature.

2. A method of producing a bipolar CMOS device for comprising an unipolar CMOS transistor with a polysilicon gate and a self-aligned NPN and VPNP transistor on a same chip as set forth in claim 1, wherein said the polysilicon gate of said MOS transistor forms an emitter of said NPN transistor and a base of said VNPN transistor.

3. A method of producing a bipolar CMOS device for comprising an unipolar CMOS transistor with a polysilicon gate and a self-aligned NPN and VPNP transistor on a same chip as set forth in claim 2, wherein said extrinsic base of the NPN transist and the said emitter of the VPNP transistor are self-aligned by means of said polysilicon gate.

4. A method of producing a bipolar CMOS device for comprising an unipolar CMOS transistor with a polysilicon gate and a self-aligned NPN and VPNP transistor on a same chip as set forth in claim 2, wherein said emitter region of the NPN transistor and said extrinsic base region of the VPNP transistor are formed by diffusing an As ions from said polysilicon gate.

* * * * *